(12) United States Patent
Shimazawa et al.

(10) Patent No.: US 7,029,770 B2
(45) Date of Patent: Apr. 18, 2006

(54) EXCHANGE-COUPLED FILM, SPIN VALVE FILM, THIN FILM MAGNETIC HEAD, MAGNETIC HEAD APPARATUS, AND MAGNETIC RECORDING/REPRODUCING APPARATUS

(75) Inventors: Koji Shimazawa, Chuo-ku (JP); Yoshihiro Tsuchiya, Chuo-ku (JP); Koichi Terunuma, Chuo-ku (JP)

(73) Assignee: TDK Corporation, Tokyo (JP)

( * ) Notice: Subject to any disclaimer, the term of this patent is extended or adjusted under 35 U.S.C. 154(b) by 74 days.

(21) Appl. No.: 10/633,669

(22) Filed: Aug. 5, 2003

(65) Prior Publication Data

US 2004/0048104 A1    Mar. 11, 2004

(30) Foreign Application Priority Data

Sep. 9, 2002    (JP)    ............................. 2002-263199

(51) Int. Cl.
*G11B 5/127*    (2006.01)

(52) U.S. Cl. ................ 428/811.5; 428/812; 360/324.11

(58) Field of Classification Search .................... None
See application file for complete search history.

(56) References Cited

U.S. PATENT DOCUMENTS

| | | | |
|---|---|---|---|
| 5,206,590 A | 4/1993 | Dieny et al. | |
| 5,422,571 A | 6/1995 | Gurney et al. | |
| 5,784,225 A | 7/1998 | Saito et al. | |
| 5,989,690 A | 11/1999 | Fujikata et al. | |
| 6,090,498 A | 7/2000 | Omata et al. | |
| 6,093,444 A | 7/2000 | Miyauchi et al. | |
| 6,287,709 B1 * | 9/2001 | Mizuguchi | .................. 428/611 |
| 6,338,899 B1 | 1/2002 | Fukuzawa et al. | |
| 6,395,388 B1 | 5/2002 | Iwasaki et al. | |
| 6,455,178 B1 | 9/2002 | Fuke et al. | |
| 6,784,509 B1 | 8/2004 | Yuasa et al. | |
| 6,819,532 B1 * | 11/2004 | Kamijo | .................. 360/324.11 |
| 2002/0051380 A1 * | 5/2002 | Kamiguchi et al. | ......... 365/158 |
| 2003/0168673 A1 | 9/2003 | Yuasa et al. | |
| 2004/0246634 A1 | 12/2004 | Yuasa et al. | |

FOREIGN PATENT DOCUMENTS

| | | |
|---|---|---|
| JP | A 6-236527 | 8/1994 |
| JP | B2 8-21166 | 3/1996 |
| JP | A 9-50611 | 2/1997 |
| JP | A 9-63021 | 3/1997 |

(Continued)

OTHER PUBLICATIONS

JPO Abstract Translation of JP 2002-074626-A (Doc. ID: JP 2002074626 A).*

(Continued)

*Primary Examiner*—Kevin M. Bernatz
(74) *Attorney, Agent, or Firm*—Oliff & Berridge PLC

(57) ABSTRACT

An exchange-coupled film has a ferromagnetic layer sandwich comprising a first ferromagnetic layer containing a ferromagnetic material of the body-centered cubic structure and a pair of second ferromagnetic layers containing a ferromagnetic material of the face-centered cubic structure and formed on respective sides of the first ferromagnetic layer; and an antiferromagnetic layer containing a disordered alloy and formed on one of the second ferromagnetic layers. It yields sufficient exchange coupling energy even in smaller thickness of the antiferromagnetic layer than before, whereby it becomes feasible to decrease the thickness of the exchange-coupled film.

9 Claims, 10 Drawing Sheets

FOREIGN PATENT DOCUMENTS

| | | |
|---|---|---|
| JP | A 9-82524 | 3/1997 |
| JP | A 9-147325 | 6/1997 |
| JP | A 9-148132 | 6/1997 |
| JP | A 10-242544 | 9/1998 |
| JP | A 2000-137906 | 5/2000 |
| JP | 2002-074626 A * | 3/2002 |
| JP | 2003-060263 A | 2/2003 |

OTHER PUBLICATIONS

Machine Translation of JP 2002-074626-A.*

* cited by examiner

Fig.2

| | FERROMAGNETIC LAYER SANDWICH | | | ANTIFERROMAGNETIC LAYER (THICKNESS) | Hex [kA/m] | Hcp [kA/m] | ta [nm] | Jk [$\mu J/m^2$] |
|---|---|---|---|---|---|---|---|---|
| | SECOND FERROMAGNETIC LAYER A (THICKNESS) | FIRST FERROMAGNETIC LAYER (THICKNESS) | SECOND FERROMAGNETIC LAYER B (THICKNESS) | | | | | |
| EXAMPLE1 | CoFe (0.5nm) | FeTa (3nm) | CoFe (0.5nm) | IrMn (10nm) | 53.7 | 16.2 | 3.34 | 341 |
| EXAMPLE2 | CoFe (0.5nm) | FeTa (3nm) | CoFe (0.5nm) | IrMn (9nm) | 45.2 | 11.9 | 3.34 | 287 |
| EXAMPLE3 | CoFe (0.5nm) | FeTa (3nm) | CoFe (0.5nm) | IrMn (7nm) | 50.7 | 14.3 | 3.34 | 322 |
| EXAMPLE4 | CoFe (0.5nm) | FeTa (3nm) | CoFe (0.5nm) | IrMn (5nm) | 53.7 | 16.2 | 3.34 | 341 |
| EXAMPLE5 | CoFe (0.5nm) | FeTa (3nm) | CoFe (0.5nm) | RuRhMn (11nm) | 36.9 | 9.2 | 3.34 | 234 |
| EXAMPLE6 | CoFe (0.5nm) | FeTa (3nm) | CoFe (0.5nm) | RuRhMn (9nm) | 41.4 | 10.5 | 3.34 | 263 |
| EXAMPLE7 | CoFe (0.5nm) | FeTa (3nm) | CoFe (0.5nm) | RuRhMn (7nm) | 43.8 | 12.4 | 3.34 | 278 |
| EXAMPLE8 | CoFe (1nm) | FeCo (2nm) | CoFe (1nm) | IrMn (5nm) | 66.7 | 17.0 | 4.30 | 545 |
| COMPARATIVE EXAMPLE1 | — | — | CoFe (3nm) | IrMn (10nm) | 26.9 | 3.1 | 3.00 | 153 |
| COMPARATIVE EXAMPLE2 | — | — | CoFe (3nm) | IrMn (5nm) | 26.9 | 3.1 | 3.00 | 153 |
| COMPARATIVE EXAMPLE3 | — | — | CoFe (2nm) | IrMn (10nm) | 32.7 | 5.9 | 2.00 | 124 |
| COMPARATIVE EXAMPLE4 | — | FeTa (2nm) | CoFe (2nm) | IrMn (5nm) | 48.3 | 9.7 | 2.00 | 184 |
| COMPARATIVE EXAMPLE5 | CoFe (2nm) | — | — | IrMn (10nm) | 18.9 | 8.6 | 3.56 | 128 |
| COMPARATIVE EXAMPLE6 | CoFe (0.5nm) | FeTa (3nm) | CoFe (0.5nm) | PtMn (15nm) | 37.3 | 31.0 | 3.34 | 236 |
| COMPARATIVE EXAMPLE7 | CoFe (0.5nm) | FeTa (3nm) | CoFe (0.5nm) | PtMn (13nm) | 34.3 | 29.5 | 3.34 | 218 |
| COMPARATIVE EXAMPLE8 | CoFe (0.5nm) | FeTa (3nm) | CoFe (0.5nm) | PtMn (10nm) | 16.6 | 16.4 | 3.34 | 105 |
| COMPARATIVE EXAMPLE9 | — | — | CoFe (3nm) | PtMn (15nm) | 64.1 | 32.5 | 3.00 | 365 |
| COMPARATIVE EXAMPLE10 | — | — | CoFe (3nm) | PtMn (5nm) | 7.3 | 18.7 | 3.00 | 41.6 |
| REFERENCE EXAMPLE1 | CoFe (2nm) | FeCo (2nm) | — | IrMn (5nm) | 41.6 | 17.4 | 4.30 | 339 |

Fig.4

| | FERROMAGNETIC LAYER SANDWICH | | | ANTIFERROMAGNETIC LAYER (THICKNESS) | Hex [kA/m] | Hcp [kA/m] | ta [nm] | Jk [μJ/m²] |
|---|---|---|---|---|---|---|---|---|
| | SECOND FERROMAGNETIC LAYER A(THICKNESS) | FIRST FERROMAGNETIC LAYER(THICKNESS) | SECOND FERROMAGNETIC LAYER B(THICKNESS) | | | | | |
| EXAMPLE1 | CoFe (0.5nm) | FeTa (3nm) | CoFe (0.5nm) | IrMn (10nm) | 53.7 | 16.2 | 3.34 | 341 |
| EXAMPLE9 | CoFe (1.5nm) | FeTa (2nm) | CoFe (0.5nm) | IrMn (10nm) | 47.4 | 11.9 | 3.56 | 320 |
| EXAMPLE10 | CoFe (1nm) | FeTa (2nm) | CoFe (1nm) | IrMn (10nm) | 57.9 | 13.8 | 3.56 | 392 |
| EXAMPLE11 | CoFe (0.5nm) | FeTa (2nm) | CoFe (1.5nm) | IrMn (10nm) | 58.1 | 12.8 | 3.56 | 393 |
| EXAMPLE12 | CoFe (1.5nm) | FeTa (1.5nm) | CoFe (0.5nm) | IrMn (10nm) | 47.4 | 11.9 | 3.56 | 320 |
| EXAMPLE13 | CoFe (1.5nm) | FeTa (1nm) | CoFe (0.5nm) | IrMn (10nm) | 52.9 | 12.9 | 3.17 | 319 |
| EXAMPLE14 | CoFe (1.5nm) | FeTa (1nm) | CoFe (0.5nm) | IrMn (10nm) | 57.6 | 14.2 | 2.78 | 304 |
| EXAMPLE15 | CoFe (1.5nm) | FeTa (0.5nm) | CoFe (0.5nm) | IrMn (10nm) | 66.7 | 17.0 | 2.39 | 303 |

Fig.5

| | FERROMAGNETIC LAYER SANDWICH | | | ANTIFERROMAGNETIC LAYER (THICKNESS) | Hex [kA/m] | Hcp [kA/m] | ta [nm] | Jk [μJ/m²] |
|---|---|---|---|---|---|---|---|---|
| | SECOND FERROMAGNETIC LAYER A (THICKNESS) | FIRST FERROMAGNETIC LAYER (THICKNESS) | SECOND FERROMAGNETIC LAYER B (THICKNESS) | | | | | |
| EXAMPLE8 | CoFe (1nm) | FeCo (2nm) | CoFe (1nm) | IrMn (5nm) | 66.7 | 17.0 | 4.30 | 545 |
| EXAMPLE16 | CoFe (1.5nm) | FeCo (2nm) | CoFe (0.5nm) | IrMn (5nm) | 64.9 | 18.1 | 4.30 | 530 |
| EXAMPLE17 | CoFe (0.5nm) | FeCo (2nm) | CoFe (1.5nm) | IrMn (5nm) | 65.9 | 16.5 | 4.30 | 538 |
| EXAMPLE18 | CoFe (1.5nm) | FeCo (2nm) | CoFe (0.5nm) | IrMn (5nm) | 64.9 | 18.1 | 4.30 | 530 |
| EXAMPLE19 | CoFe (1.5nm) | FeCo (1.5nm) | CoFe (0.5nm) | IrMn (5nm) | 71.2 | 18.5 | 3.73 | 504 |
| EXAMPLE20 | CoFe (1.5nm) | FeCo (1nm) | CoFe (0.5nm) | IrMn (5nm) | 78.2 | 18.7 | 3.15 | 468 |
| EXAMPLE21 | CoFe (1.5nm) | FeCo (0.5nm) | CoFe (0.5nm) | IrMn (5nm) | 61.9 | 13.9 | 2.58 | 303 |

Fig.7

| | ANTIFERROMAGNETIC LAYER (THICKNESS) | LAYER STRUCTURE | | | MR RATIO (%) | AMOUNT OF RESISTANCE CHANGE ($\Omega/cm^2$) |
| --- | --- | --- | --- | --- | --- | --- |
| | | SECOND FERROMAGNETIC LAYER A (THICKNESS) | FIRST FERROMAGNETIC LAYER (THICKNESS) | SECOND FERROMAGNETIC LAYER B (THICKNESS) | | |
| EXAMPLE 22 | IrMn (5nm) | CoFe (0.5nm) | FeTa (0.5nm) | CoFe (0.5nm) | 16.2 | 3.39 |
| EXAMPLE 23 | IrMn (5nm) | CoFe (0.5nm) | FeTa (0.7nm) | CoFe (0.5nm) | 15.9 | 3.33 |
| EXAMPLE 24 | IrMn (5nm) | CoFe (0.5nm) | FeTa (0.9nm) | CoFe (0.5nm) | 15.8 | 3.27 |
| EXAMPLE 25 | IrMn (5nm) | CoFe (0.5nm) | FeCo (0.5nm) | CoFe (0.5nm) | 16.4 | 3.41 |
| EXAMPLE 26 | IrMn (5nm) | CoFe (0.5nm) | FeCo (0.7nm) | CoFe (0.5nm) | 16.1 | 3.37 |
| EXAMPLE 27 | IrMn (5nm) | CoFe (0.5nm) | FeCo (0.9nm) | CoFe (0.5nm) | 15.7 | 3.26 |
| COMPARATIVE EXAMPLE 11 | IrMn (5nm) | CoFe (1.5nm) | — | — | 16.0 | 3.23 |
| COMPARATIVE EXAMPLE 12 | PtMn (13nm) | CoFe (1.5nm) | — | — | 15.1 | 2.78 |

EXCHANGE-COUPLED FILM, SPIN VALVE FILM, THIN FILM MAGNETIC HEAD, MAGNETIC HEAD APPARATUS, AND MAGNETIC RECORDING/REPRODUCING APPARATUS

BACKGROUND OF THE INVENTION

1. Field of the Invention

The present invention relates to an exchange-coupled film including ferromagnetic layers and an antiferromagnetic layer, a spin valve film using it, a thin film magnetic head, a magnetic head apparatus, and a magnetic recording/reproducing apparatus.

2. Related Background Art

The known thin film magnetic heads include thin film magnetic heads provided with a spin valve film in which an antiferromagnetic layer, a ferromagnetic layer, a nonmagnetic, conductive layer, and a ferromagnetic layer are successively stacked (e.g., Japanese examined Patent Publication No. 08-21166 and Japanese Patent Application Laid-Open No. 06-236527). In such thin film magnetic heads a direction of magnetization of the ferromagnetic layer in contact with the antiferromagnetic layer is pinned by exchange coupling between the antiferromagnetic layer and the ferromagnetic layer. In order to improve the reliability of the thin film magnetic heads, exchange coupling energy of the exchange-coupled film including the antiferromagnetic layer and the ferromagnetic layer exchange coupled with the antiferromagnetic layer needs to be sufficiently high.

The known exchange-coupled films include the exchange-coupled films using a PtMn layer and a CoFe layer (e.g., Japanese Patent Application Laid-Open No. 09-147325), the exchange-coupled films using an NiMn layer and a CoFe layer (e.g., Japanese Patent Applications Laid-Open No. 09-63021 and No. 09-50611), the exchange-coupled films using an IrMn layer and a CoFe layer (e.g., Japanese Patent Application Laid-Open No. 09-148132), the exchange-coupled films using an RuRhMn layer and an NiFe layer (e.g., Japanese Patent Application Laid-Open No. 10-242544), and so on.

There are other known exchange-coupled films in which the ferromagnetic layer thereof is comprised of a ferromagnetic layer sandwich of trilayered structure consisting of a ferromagnetic layer/a nonmagnetic metal intermediate layer/a ferromagnetic layer, so as to antiferromagnetically exchange couple the two ferromagnetic layers with each other, thereby achieving an effective increase of exchange coupling force from the antiferromagnetic layer to the ferromagnetic layer sandwich (e.g., Japanese Patent Application Laid-Open No. 2000-137906).

Furthermore, disclosed is a method of interposing a matching ferromagnetic layer between the antiferromagnetic layer and the ferromagnetic layer in the exchange-coupled film to enhance exchange coupling (e.g., Japanese Patent Application Laid-Open No. 09-82524).

SUMMARY OF THE INVENTION

Concerning the thin film magnetic heads, there are demands for readout from magnetic recording media in which information is recorded in higher density, and, in order to meet the demands, it is necessary to achieve so-called gap narrowing to narrow the gap between a pair of magnetic shield layers placed on the both sides of the spin valve film in the thin film magnetic head.

It is difficult to further decrease the currently achieved thicknesses of insulating layers among the layers placed between the magnetic shield layers, and it is thus necessary to decrease the thickness of the spin valve film. In order to make the spin valve film thinner, it is then effective to decrease the thickness of the antiferromagnetic layer, which has the thickness larger than those of the other layers in the spin valve film. However, a further decrease of the current thickness of the antiferromagnetic layer in the conventional exchange-coupled films will result in posing a problem of failure in yielding sufficient exchange coupling energy.

The present invention has been accomplished in view of the above problem and an object of the invention is to provide an exchange-coupled film that can be made thinner than before and that yields sufficient exchange coupling energy, a spin valve film using it, a thin film magnetic head, a magnetic head apparatus, and a magnetic recording/reproducing apparatus.

The Inventors conducted elaborate research, found that sufficient exchange coupling energy was yielded even with decrease in the thickness of the antiferromagnetic layer from that before, by the exchange-coupled film adopting a ferromagnetic layer sandwich comprising a first ferromagnetic layer containing a ferromagnetic material of the body-centered cubic structure; and a pair of second ferromagnetic layers containing a ferromagnetic material of the face-centered cubic structure and laid on respective sides of the first ferromagnetic layer, and an antiferromagnetic layer containing a disordered alloy and kept in contact with one of the second ferromagnetic layers, and thereby completed the present invention.

An exchange-coupled film according to the present invention is an exchange-coupled film in which an antiferromagnetic layer and a ferromagnetic layer sandwich are stacked and in which a direction of magnetization of the ferromagnetic layer sandwich is pinned, wherein the ferromagnetic layer sandwich comprises a first ferromagnetic layer containing a ferromagnetic material of the body-centered cubic structure, and a pair of second ferromagnetic layers containing a ferromagnetic material of the face-centered cubic structure and formed on respective sides of the first ferromagnetic layer, and wherein the antiferromagnetic layer contains a disordered alloy and is kept in contact with one of the second ferromagnetic layers.

In the exchange-coupled film of the present invention, the direction of magnetization of the ferromagnetic layer sandwich is pinned by exchange coupling with the antiferromagnetic layer. At this time, sufficient exchange coupling energy is yielded even in a smaller thickness of the antiferromagnetic layer than before, so as to adequately pin the direction of magnetization of the ferromagnetic layer sandwich; therefore, the thickness of the exchange-coupled film can be made smaller than before.

In the above exchange-coupled film, preferably, the ferromagnetic layer sandwich further comprises a third ferromagnetic layer placed through a nonmagnetic intermediate layer on the opposite side to the antiferromagnetic layer with the other second ferromagnetic layer in between.

In this configuration, the third ferromagnetic layer is antiferromagnetically exchange coupled through the nonmagnetic intermediate layer with the first ferromagnetic layer and the pair of second ferromagnetic layers on the both sides of the first ferromagnetic layer in the ferromagnetic layer sandwich, which achieves an effective increase of the force of the antiferromagnetic layer's pinning the direction of magnetization of the ferromagnetic layer sandwich. Since a closed magnetic field is created, leakage is reduced of the magnetic field from the ferromagnetic layer structure.

A spin valve film according to the present invention comprises the foregoing exchange-coupled film; a nonmagnetic, conductive layer laid on the ferromagnetic layer sandwich of the exchange-coupled film; and a free layer laid on the nonmagnetic, conductive layer and containing a ferromagnetic material.

Since the spin valve film of the present invention adopts the aforementioned exchange-coupled film, it can adequately pin the direction of magnetization of the ferromagnetic layer sandwich and decrease the thickness of the spin valve film.

A thin film magnetic head according to the present invention comprises the above-stated spin valve film; and a pair of magnetic shield layers placed at positions where the spin valve film is sandwiched therebetween from both sides in a stack direction of the spin valve film, and containing a soft magnetic material.

Since the thin film magnetic head of the present invention has the aforementioned exchange-coupled film, the thickness of the spin valve film can be decreased. For this reason, the gap can be narrowed between the pair of magnetic shield layers on the both sides of the spin valve film and it becomes feasible to detect the leakage field from media in which magnetic information is recorded in higher density.

The above thin film magnetic head may comprise a pair of electrode layers electrically connected to the spin valve film and adapted for allowing an electric current to flow parallel to a film surface of the spin valve film.

In the so-called CIP type thin film magnetic head as described above, the decrease in the thickness of the antiferromagnetic layer because of the inclusion of the aforementioned exchange-coupled film results in decreasing a shunt ratio of an electric current flowing in the antiferromagnetic layer among electric currents flowing in the spin valve film and thereby increasing the MR ratio of the thin film magnetic head.

The above thin film magnetic head may comprise a pair of electrode layers electrically connected to the spin valve film and adapted for allowing an electric current to flow perpendicular to a film surface of the spin valve film.

In the so-called CPP type thin film magnetic head as described above, the decrease in the thickness of the antiferromagnetic layer because of the inclusion of the aforementioned exchange-coupled film results in decreasing the resistance during flow of an electric current through the antiferromagnetic layer in the spin valve film and thereby increasing the MR ratio of the thin film magnetic head.

A magnetic head apparatus according to the present invention comprises the above-stated thin film magnetic head, and a head supporting device for supporting the thin film magnetic head.

A magnetic recording/reproducing apparatus according to the present invention comprises the above-stated magnetic head apparatus and a magnetic recording medium for implementing magnetic recording/reproduction in collaboration with the thin film magnetic head of the magnetic head apparatus.

Since the above magnetic head apparatus and magnetic recording/reproducing apparatus are provided with the aforementioned thin film magnetic head, it becomes feasible to increase the recording density.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

FIG. 2 is a table showing compositions and characteristics of exchange-coupled films in Examples 1–8, Comparative Examples 1–10, and Reference Example 1.

FIG. 4 is a table showing compositions and characteristics of exchange-coupled films in Example 1 and Examples 9–15.

FIG. 5 is a table showing compositions and characteristics of exchange-coupled films in Example 8 and Examples 16–21.

FIG. 7 is a drawing showing film compositions and characteristics of thin film magnetic heads in Examples 22–27 and Comparative Examples 11 and 12.

DESCRIPTION OF THE PREFERRED EMBODIMENTS

The preferred embodiments of the present invention will be described below in detail with reference to the accompanying drawings. In the description of the drawings, identical or equivalent elements will be denoted by the same reference symbols, without redundant description thereof.

Figure 1:
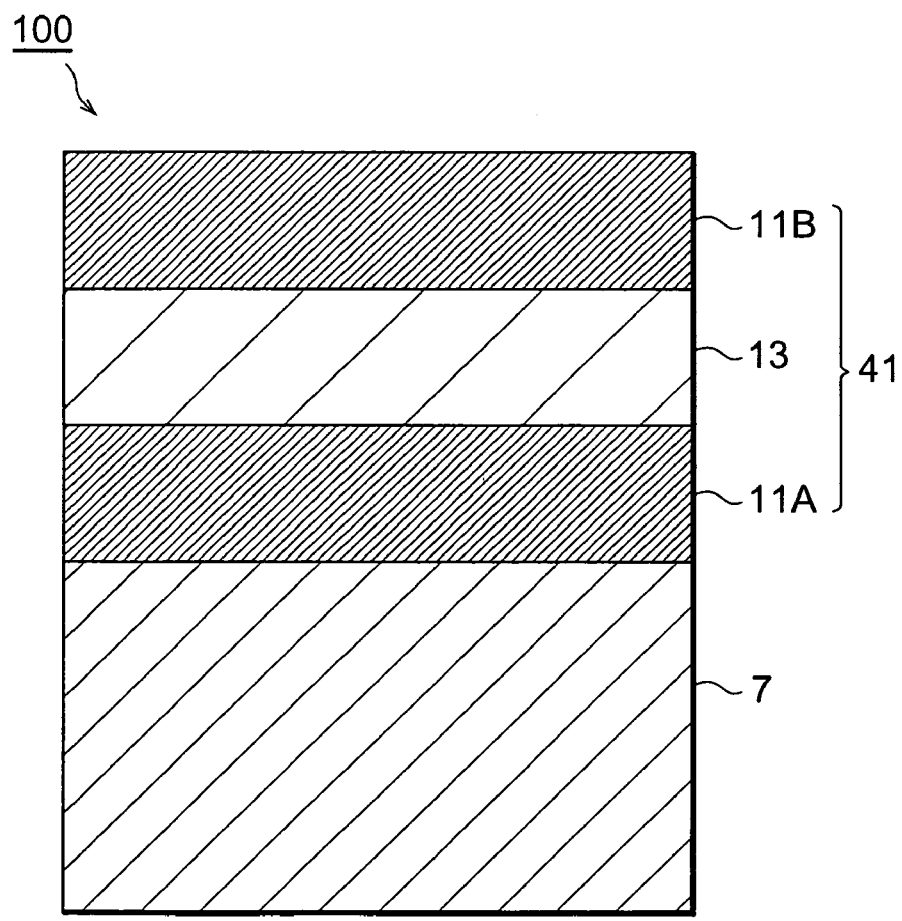
FIG. 1 is a schematic illustration showing a sectional structure of an exchange-coupled film according to an embodiment of the present invention.

First, the exchange-coupled film according to an embodiment of the present invention will be described with reference to FIG. 1. The exchange-coupled film 100 according to the present embodiment has an antiferromagnetic layer 7 of disordered alloy structure, and a ferromagnetic layer sandwich 41 stacked on the antiferromagnetic layer 7.

The ferromagnetic layer sandwich 41 consists of a first ferromagnetic layer 13 containing a ferromagnetic material of the body-centered cubic structure (BCC), and a pair of second ferromagnetic layer 11A and second ferromagnetic layer 11B containing a ferromagnetic material of the face-centered cubic structure (FCC) and formed on respective sides of the first ferromagnetic layer 13. The second ferromagnetic layer 11A is in contact with the antiferromagnetic layer 7.

The first ferromagnetic layer 13 is preferably made of Fe or an iron-rich alloy of the body-centered cubic structure. The iron-rich alloy can be selected, for example, from $Fe_{95}Ta$ containing iron 95%, $Fe_{90}Co$ containing iron 90%, $Fe_{50}Co$ containing iron 50%, and so on.

The second ferromagnetic layers 11A and 11B can be made of a ferromagnetic material of the face-centered cubic structure; for example, one selected from Co, $Co_{90}Fe$ containing cobalt 90%, $Ni_{80}Fe$ containing nickel 80%, and so on.

The antiferromagnetic layer 7 is an antiferromagnetic material of the disordered alloy structure; for example, it can be an alloy of γ-Mn base structure and is preferably one of alloys such as IrMn, RuRhMn, FeMn, RuMn, and so on. Compositions of these alloys can be, for example, $IrMn_{80}$, $FeMn_{80}$, $RuRhMn_{80}$, $RuMn_{80}$, and so on.

The exchange-coupled film may be of the so-called synthetic structure in which a third ferromagnetic layer is laid through a nonmagnetic layer on the second ferromagnetic layer 11B so that the third ferromagnetic layer is antiferromagnetically exchange coupled through the nonmagnetic layer with the first ferromagnetic layer 13 and the second ferromagnetic layers 11A, 11B. In this case, the antiferromagnetic layer 7 effectively increases its pinning force for pinning the direction of magnetization of the ferromagnetic layer sandwich 41.

The exchange-coupled film described above can be readily formed by depositing the antiferromagnetic layer 7, second ferromagnetic layer 11A, first ferromagnetic layer 13, and second ferromagnetic layer 11B on an unrepresented substrate in this order or in the reverse order by sputtering or the like.

In the exchange-coupled film of the present embodiment, sufficiently high exchange coupling energy is yielded even in smaller thickness of the antiferromagnetic layer than before, which permits decrease in the thickness of the exchange-coupled film.

There are no specific restrictions on the thicknesses of the first ferromagnetic layer 13, second ferromagnetic layer 11A, and second ferromagnetic layer 11B, but it is preferable to set the thickness of the first ferromagnetic layer 13 in the range of approximately 0.5 to 3 nm and set the thicknesses of the second ferromagnetic layers 11A, 11B in the range of approximately 0.5 to 1.5 nm. There are no specific restrictions on the thickness of the antiferromagnetic layer 7, either, but it is preferable to set the thickness in the range of approximately 5 to 10 nm.

We checked the characteristics of exchange coupling energy and others of exchange-coupled films according to the present embodiment.

EXAMPLE 1–4

Exchange-coupled films were formed as follows: Ta was deposited as an under layer in the thickness of 5 nm on a substrate of AlTiC or the like having an under film of $Al_2O_3$, thereafter the second ferromagnetic layer A of the face-centered cubic structure, the first ferromagnetic layer of the body-centered cubic structure, and the second ferromagnetic layer B of the face-centered cubic structure were successively deposited to form a ferromagnetic layer sandwich, the antiferromagnetic layer of a disordered alloy was further formed on the second ferromagnetic layer B, and Ta was further deposited as a capping layer in the thickness of 5 nm thereon. Each of the layers was made by sputtering.

As presented in the table of FIG. 2, the film composition of the ferromagnetic layer sandwich in each of Examples was the second ferromagnetic layer A/first ferromagnetic layer/second ferromagnetic layer B: $Co_{90}Fe$ 0.5 nm thick, $Fe_{95}Ta$ 3 nm thick, and $Co_{90}Fe$ 0.5 nm thick in the order named. The antiferromagnetic layer was made of $Ir_{20}Mn_{80}$ and in the thickness being one of 10, 9, 7, and 5 nm in Examples 1 to 4, respectively. In FIG. 2, the second ferromagnetic layer B was in contact with the antiferromagnetic layer.

EXAMPLES 5–7

Exchange-coupled films of Examples 5–7 were made in the same manner as in Example 1 except that the antiferromagnetic layer was made of $RuRhMn_{80}$ of another disordered alloy, instead of IrMn, and in the thickness being one of 11, 9, and 7 nm in Examples 5–7, respectively.

EXAMPLE 8

An exchange-coupled film of Example 8 was made in the same manner as in Example 4 except that the film composition of the ferromagnetic layer sandwich was the second ferromagnetic layer A/first ferromagnetic layer/second ferromagnetic layer B: $Co_{90}Fe$ 1 nm thick, $Fe_{50}Co$ 2 nm thick, and $Co_{90}Fe$ 1 nm thick in the order named.

COMPARATIVE EXAMPLES 1–4

Exchange-coupled films of Comparative Example 1 and Comparative Example 2 were made in the same manner as in Example 1 and in Example 4, respectively, except that the ferromagnetic layer sandwich was a single layer of $Co_{90}Fe$ 3 nm thick. Exchange-coupled films of Comparative Example 3 and Comparative Example 4 were made in the same manner as in Example 1 and Example 4, respectively, except that the ferromagnetic layer sandwich was a single layer of $Co_{90}Fe$ 2 nm thick.

COMPARATIVE EXAMPLE 5

An exchange-coupled film of Comparative Example 5 was made in the same manner as in Example 1 except that the ferromagnetic layer sandwich was one consisting of two layers of $Co_{90}Fe$ 2 nm thick and $Fe_{95}Ta$ 2 nm thick and the layer of $Ir_{20}Mn_{80}$ was laid on the FeTa layer.

COMPARATIVE EXAMPLES 6–8

Exchange-coupled films of Comparative Examples 6–8 were made in the same manner as in Example 1 except that a layer of PtMn being an ordered alloy was laid as an antiferromagnetic layer in the thickness being one of 15, 13, and 10 nm in Comparative Examples 6–8, respectively.

COMPARATIVE EXAMPLES 9, 10

Exchange-coupled films of Comparative Examples 9, 10 were made in structure in which the ferromagnetic layer sandwich was a single layer of $Co_{90}Fe$ 3 nm thick and in which the antiferromagnetic layer was made of PtMn being an ordered alloy and in the thickness being one of 15 and 5 nm in Comparative Examples 9 and 10, respectively.

Reference Example 1

An exchange-coupled film was made in structure in which the ferromagnetic layer sandwich was a stack of two layers of $Co_{90}Fe$ 2 nm thick and $Fe_{50}Co$ 2 nm thick and in which a layer of $IrMn_{80}$ was laid on the $Fe_{50}Co$ layer.

Figure 3:
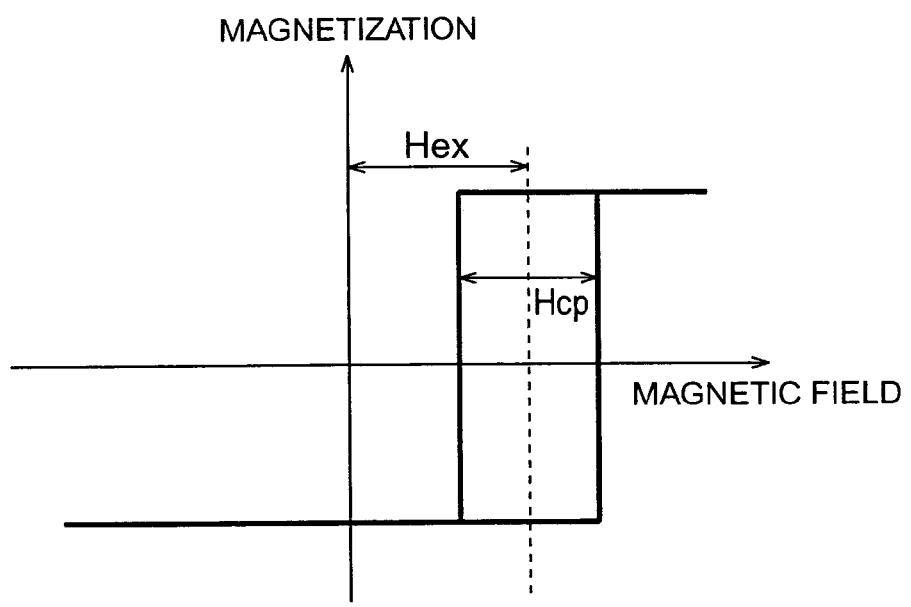
FIG. 3 is a drawing showing a typical example of magnetization curves in the direction of the magnetization easy axis of the exchange-coupled films in Examples 1–8.

A magnetization curve was measured in the direction of the magnetization easy axis for each of the exchange-coupled films obtained as described above. FIG. 3 shows a typical example of the magnetization curves obtained. The magnetization curve of the ferromagnetic layer sandwich had a shift from the origin 0 because of the exchange coupling with the antiferromagnetic layer, the amount of this shift was obtained as exchange coupling field Hex, and the lateral width Hcp of the hysteresis loop was also obtained. The exchange coupling energy Jk of each exchange-coupled film was calculated based on the exchange coupling field Hex. The exchange coupling energy was estimated by Jk $[J/m^2]=(Hex[A/m])\times(Ms_0[Wb/m^2])\times(ta[m])$, using CoFe reduced thickness ta obtained by converting the thickness of the ferromagnetic layer sandwich to that of the $Co_{90}Fe$ layer with saturation magnetization $Ms_0$.

The results of these are given in the table of FIG. 2. For calculating the CoFe reduced thickness ta in the calculation of exchange coupling energy Jk, the saturation magnetizations Mso adopted were as follows: 1.9 Wb/m$^2$ as the saturation magnetization of $Co_{90}Fe_{10}$, 1.48 Wb/m$^2$ as the saturation magnetization of $Fe_{95}Ta$, and 2.18 Wb/m$^2$ as the saturation magnetization of $Fe_{50}Co_{50}$.

It is seen that the exchange-coupled films using the ferromagnetic layer sandwich with the pair of $Co_{90}Fe$ layers of the face-centered cubic structure on the both sides of the FeTa layer of the body-centered cubic structure, and the layer of IrMn being the disordered alloy as an antiferromagnetic layer yield the exchange coupling energy Jk of not less than 287 μJ/m$^2$ where the antiferromagnetic layer has the thickness in the range of 10–5 nm, as in Examples 1–4.

It is also seen that the exchange-coupled films using the same ferromagnetic layer sandwich as in Examples 1–4 and the antiferromagnetic layer of RuRhMn of the disordered alloy also yield the high exchange coupling energy Jk of not less than 234 μJ/m$^2$ where the antiferromagnetic layer has the thickness in the range of 7–11 nm, as in Examples 5–7.

Furthermore, as in Example 8, the exchange-coupled film comprised of the ferromagnetic layer sandwich with the pair of $Co_{90}Fe$ layers of the face-centered cubic structure on the both sides of the $Fe_{50}Co$ layer of the body-centered cubic structure, and the antiferromagnetic layer of IrMn also yields the high exchange coupling energy of 545 μJ/m$^2$ where the antiferromagnetic layer has the thickness of 5 nm.

On the other hand, the conventionally known exchange-coupled films using the single layer of $Co_{90}Fe$ as the ferromagnetic layer sandwich and IrMn as the antiferromagnetic layer failed to yield the exchange coupling energy Jk over 184 μJ/m$^2$ where the antiferromagnetic layer had the thickness in the range of 5–10 nm, as in Comparative Examples 1–4.

The exchange-coupled film using IrMn as the antiferromagnetic layer and the ferromagnetic layer sandwich of two layers of $Co_{90}Fe$/FeTa as the ferromagnetic layer sandwich also failed to yield sufficient exchange coupling energy Jk, as in Comparative Example 5.

In the case of the exchange-coupled films of the composition consisting of the ferromagnetic layer sandwich of Example 1 and PtMn being the ordered alloy, the exchange coupling energy Jk dominantly decreases with decrease in the thickness of the antiferromagnetic layer, and the exchange coupling energy Jk becomes as low as approximately 105 μJ/m$^2$ and insufficient where the antiferromagnetic layer has the thickness of 10 nm, as in Comparative Examples 6–8.

In addition, in the case of the exchange-coupled films of the conventional composition consisting of PtMn of the ordered alloy and $Co_{90}Fe$, as seen in Comparative Examples 9, 10, the exchange-coupled film demonstrates the sufficient exchange coupling energy of 365 μJ/m$^2$ where the antiferromagnetic layer has the thickness of approximately 15 nm, whereas the exchange coupling energy decreases to approximately 41.6 μJ/m$^2$ and is thus insufficient where the thickness of PtMn as the antiferromagnetic layer becomes as thin as about 5 nm.

As evidenced by the above data, it was verified that the exchange-coupled films having the sufficient exchange coupling energy even with the antiferromagnetic layer as thin as approximately 10 nm or less were substantiality by the exchange-coupled films consisting of the combination of the ferromagnetic layer sandwich having the pair of ferromagnetic layers containing the ferromagnetic material of the face-centered cubic structure on the both sides of the first ferromagnetic layer containing the ferromagnetic material of the body-centered cubic structure, with the antiferromagnetic layer of the disordered alloy.

As seen from Reference Example 1, the $Co_{90}Fe/Fe_{50}Co$/IrMn-based exchange-coupled film also demonstrates the high exchange coupling energy Jk of 339 μJ/m$^2$, as compared with Comparative Example 1 and others. However, the exchange coupling energy Jk becomes higher when the $Fe_{50}Co$ layer of the body-centered cubic structure is placed between the $Co_{90}Fe$ layers of the face-centered cubic structure, as in the case of the $Co_{90}Fe/Fe_{50}Co/Co_{90}Fe$/IrMn-based exchange-coupled film as in Example 8.

The lateral widths Hcp of the hysteresis loops of the magnetic curves fall in the range of approximately 9.2 to 17 kA/m in Examples 1–8, which are not a cause for concern.

Next, changes of the exchange coupling energy and others were measured with change in the thicknesses of the three ferromagnetic layers forming the ferromagnetic layer sandwich, in the case of the exchange-coupled film of the composition of $Co_{90}Fe/Fe_{95}Ta/Co_{90}Fe/IrMn_{80}$ as in Example 1 and in the case of the exchange-coupled film of the composition of $Co_{90}Fe/Fe_{50}Co/Co_{90}Fe/IrMn_{80}$ as in Example 8.

EXAMPLES 9–15

The exchange-coupled films of Examples 9–15 were made in the same manner as in Example 1 except that the thicknesses of the respective layers of $Co_{90}Fe/Fe_{95}Ta/Co_{90}Fe$ as in ferromagnetic layer sandwich were changed as described in the table of FIG. 4.

EXAMPLES 16–21

The exchange-coupled films of Examples 16–21 were made in the same manner as in Example 8 except that the thicknesses of the respective layers of $Co_{90}Fe/Fe_{50}Co/Co_{90}Fe$ in the ferromagnetic layer sandwich were changed as described in the table of FIG. 5.

As seen from Examples 9–11 (FIG. 4), the $Co_{90}Fe/Fe_{95}Ta/Co_{90}Fe$/IrMn-based exchange-coupled films demonstrated a slight increase of the exchange coupling energy Jk as the second ferromagnetic layer B in contact with the antiferromagnetic layer increased its thickness. However, when consideration is given to the increase rate being small and to an output drop due to shunt loss of electric current, the thickness of the second ferromagnetic layer B is considered to be preferably determined in the range of approximately 0.5 to 1.0 nm. On the other hand, as seen from Examples 8, 16, and 17 (FIG. 5), the changes in the thicknesses of the second ferromagnetic layer A and the second ferromagnetic layer B had little effect on the exchange copling energy Jk in the case of the $Co_{90}Fe/Fe_{50}Co/Co_{90}Fe/IrMn$-based exchange-coupled films.

Furthermore, as seen from Examples 12–15 (FIG. 4) and Examples 18–21 (FIG. 5), these two types of exchange-coupled films demonstrated a slight increase of the exchange coupling energy Jk with increase in the thickness of the first ferromagnetic layer but the increase rate was not so large.

Figure 6:
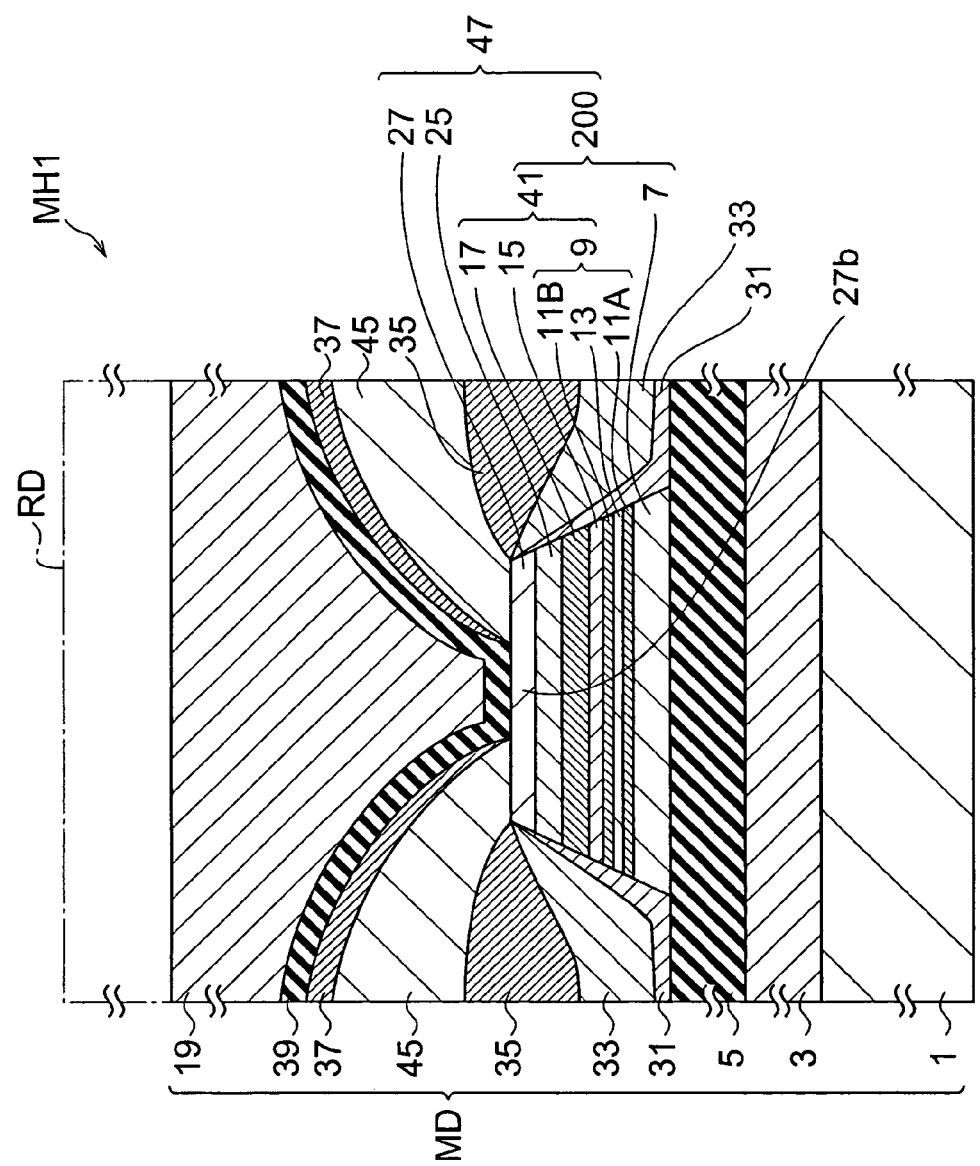
FIG. 6 is a schematic illustration showing a sectional structure of a thin film magnetic head according to an embodiment of the present invention.

Subsequently, the spin valve film and thin film magnetic head MH1 according to an embodiment of the present invention will be described with reference to FIG. 6. The thin film magnetic head MH1 is provided with a magnetic detecting device MD as a reproducing head and a magnetic field creating device RD as a recording head. The magnetic detecting device MD is comprised of nonmagnetic substrate 1, lower magnetic shield layer 3, lower gap layer 5, spin valve film 47, electrode layer 45, hard magnetic layer 33, upper gap layer 39, upper magnetic shield layer 19, and so on.

The nonmagnetic substrate 1 is made of a material of $Al_2O_3$-TiC or the like. The lower magnetic shield layer 3 is made of a soft magnetic material such as NiFe, sendust, FeCo, FeCoNi, or the like and is deposited on the nonmagnetic substrate 1. The thickness of the lower magnetic shield layer 3 is set in the range of 0.5 μm to 4 μm.

The lower gap layer 5 is made of a nonmagnetic insulator such as $Al_2O_3$, AlN, $SiO_2$, or the like and is deposited on the lower magnetic shield layer 3. The thickness of the lower gap layer 5 is set in the range of 5 nm to 30 nm.

The spin valve film 47 is a GMR (Giant Magneto Resistive) element, and includes antiferromagnetic layer 7, ferromagnetic layer sandwich 41, nonmagnetic, conductive layer 25, and free layer 27, which are deposited in order on the lower gap layer 5.

The antiferromagnetic layer 7 is similar to the antiferromagnetic layer 7 of the exchange-coupled film 100 according to the aforementioned embodiment, and is deposited on the lower gap layer 5.

The ferromagnetic layer sandwich 41 consists of the following layers in order from the bottom: second ferromagnetic layer 11A containing a material of the face-centered cubic structure, first ferromagnetic layer 13 containing a material of the body-centered cubic structure, second ferromagnetic layer 11B containing a material of the face-centered cubic structure, nonmagnetic intermediate layer 15, and third ferromagnetic layer 17, which are deposited in the order named on the antiferromagnetic layer 7.

The second ferromagnetic layer 11A, first ferromagnetic layer 13, and second ferromagnetic layer 11B are similar to those of the exchange-coupled film 100 according to the aforementioned embodiment, and these three layers are referred to together as layer structure 9 herein.

The nonmagnetic intermediate layer 15 is a nonmagnetic metal layer of Ru or the like and the third ferromagnetic layer 17 is a ferromagnetic material of FeCo or the like. The thickness of the nonmagnetic intermediate layer 15 is set in the range where the layer structure 9 can be antiferromagnetically exchange coupled with the third ferromagnetic layer 17; for example, it is set in the range of approximately 0.3 to 1.2 nm. The third ferromagnetic layer 17 is preferably made of the same material as the second ferromagnetic layers 11A, 11B and the thickness thereof is set to be approximately equal to that of the layer structure 9.

Then the ferromagnetic layer sandwich 41 and the antiferromagnetic layer 7 form the exchange-coupled film 200.

In the exchange-coupled film 200 of this configuration, as described previously, the direction of magnetization of the layer structure 9 is pinned along a certain direction (a direction perpendicular to the track width direction) by the exchange coupling field at the interface between the antiferromagnetic layer 7 and the second ferromagnetic layer 11A. Furthermore, the layer structure 9 is antiferromagnetically exchange coupled through the nonmagnetic intermediate layer 15 with the third ferromagnetic layer 17, so that the magnetization of the third ferromagnetic layer 17 is pinned in the direction opposite to the magnetization of the layer structure 9. Therefore, the magnetization of the ferromagnetic layer sandwich 41 is stably pinned in the predetermined direction by the antiferromagnetic layer 7.

Since in the ferromagnetic layer sandwich 41 the layer structure 9 and the third ferromagnetic layer 17 are antiferromagnetically exchange coupled with each other through the nonmagnetic intermediate layer 15, the antiferromagnetic layer 7 demonstrates an effective increase of its force of pinning the direction of magnetization of the ferromagnetic layer sandwich 41, thus offering higher reliability. Since the magnetization is unlikely to leak from the ferromagnetic layer sandwich 41, the reliability is further improved.

The nonmagnetic, conductive layer 25 is made of an electrically conductive, nonmagnetic material such as Cu, Ru, Rh, Ir, Au, Ag, or the like and is deposited on the third ferromagnetic layer 17. The thickness of the nonmagnetic, conductive layer 25 is set in the range of 1 nm to 4 nm.

The free layer 27 is made of a ferromagnetic material such as Fe, Co, Ni, NiFe, CoFe, CoZrNb, FeCoNi, or the like and is deposited on the nonmagnetic, conductive layer 25. The thickness of the free layer 27 is set in the range of 0.5 nm to 10 nm.

Track part 27b being a central region of the free layer 27 functions as a portion in which the direction of magnetization is changed by the leakage field from the outside. The optical track width is set at the level of approximately 0.1 μm.

The hard magnetic layer 33 is placed so as to sandwich the spin valve film 47 from the both ends, and applies a bias magnetic field to the free layer 27.

The hard magnetic layer 33 is made of a hard magnetic material with high coercive force such as CoCrPt, CoPt, CoTa, or the like and the gap between hard magnetic layer regions 33, 33 is set at approximately 0.5 μm at the narrowest position.

An under layer 31 is formed below the hard magnetic layer 33, is made of a metal material such as TiW, Ta, CrTi, or the like, and is deposited over the side faces of the spin valve film 47 and over the lower gap layer 5. A protective layer 35 of Ta, $Al_2O_3$, or the like is formed on each hard magnetic layer region 33. The under layer 31, hard magnetic layer 33, and protective layer 35 as described can be deposited after the deposition of the spin valve film 47 and subsequent patterning of the spin valve film 47 (applicable techniques include ion milling, RIE, etc.).

A pair of electrode layers 45, 45 are placed apart from each other on the left and right of the track part 27b of the free layer 27 and are deposited over the protective layer 35 on the both sides. The electrode layers 45 are made, for example, of an electroconductive material such as Au, Ag, or the like and supply an electric current (sense current) in parallel with the stack direction of the spin valve film 47 into the spin valve film 47.

Namely, electrons supplied from one electrode layer 45 migrate in parallel with the film surface in the spin valve film 47 to reach the other electrode layer 45. An electric current flows in the opposite direction to the migration of electrons.

The spacing between the pair of electrode layers 45, 45 is set at about 0.1 μm at the narrowest position. The thin film magnetic head of this type is called a CIP (Current in Plane) type GMR head.

A protective layer 37 is deposited on each electrode layer 45 and the protective layer 37 is made of Ta, $Al_2O_3$, or the like.

The upper gap layer 39 is made of a nonmagnetic insulator such as $Al_2O_3$, AlN, $SiO_2$, or the like and is deposited over the protective layer 37 and over the upper surface of the track part 27b of the free layer 27. The thickness of the upper gap layer 39 is set in the range of 5 nm to 30 nm.

The upper magnetic shield layer 19 is made of a soft magnetic material such as NiFe, sendust, FeCo, FeCoNi, or the like and is deposited on the upper gap layer 39. The thickness of the upper magnetic shield layer 19 is set in the range of 0.5 μm to 4 μm. Since the magnetic shield layers 3, 19 each are made of the soft magnetic material, they prevent leakage fields except for the leakage field from the magnetization transition area as a detection target from entering the interior of the spin valve film 47.

Next, the functions of the spin valve film 47 and the thin film magnetic head MH1 will be described. The track part 27b of the free layer 27 is kept in single domain structure in which the magnetization thereof is directed in the same track width direction as the magnetization of the hard magnetic layer 33, by the bias magnetic field created by the pair of hard magnetic layer regions 33, 33. Then the orientation of the magnetization in the track part 27b of the free layer 27 varies depending upon the leakage field from the magnetization transition area of the magnetic recording medium or the like, i.e., depending upon whether the magnetization transition area is pole N or pole S.

Since the orientation of magnetization of the ferromagnetic layer sandwich 41 is pinned by the antiferromagnetic layer 7, the transmissibility of electrons (electric current) between the pair of electrode layers 45 varies depending upon a resistance change according to a cosine between magnetization directions of the track part of free layer 27 and the third ferromagnetic layer 17 in the ferromagnetic layer sandwich 41. This variation of electric current is detected to detect the leakage field from the magnetization transition area as a detection object of the magnetic recording medium. The magnetic field can be detected by detecting the voltage while keeping the supplied current (sense current) constant, and it is common practice to employ the detection of this type.

Since the present example adopts the exchange-coupled film 200 including the antiferromagnetic layer 7 and the layer structure 9, similar to the exchange-coupled film 100 of the aforementioned embodiment, for pinning the magnetization of the ferromagnetic layer sandwich 41 including the third ferromagnetic layer 17, the direction of magnetization of the ferromagnetic layer sandwich 41 including the third ferromagnetic layer 17 is pinned by sufficient exchange coupling energy while keeping the thickness of the antiferromagnetic layer 7 smaller than before.

Since this permits the spin valve film 47 to be made thinner and also permits the gap to be made narrower between the upper magnetic shield layer 19 and the lower magnetic shield layer 3 of the thin film magnetic head MH1, it becomes feasible to achieve readout of the leakage field from the magnetic recording media in which information is recorded in higher density.

Furthermore, since the thickness of the antiferromagnetic layer 7 can be made thinner than before, it is feasible to decrease the shunt ratio of the sense current flowing in the antiferromagnetic layer 7 among the electric currents flowing in the spin valve film 47. This results in increasing the MR ratio and the amount of resistance change of the thin film magnetic head and thus enables implementation of higher output of the thin film magnetic head.

Since the direction of magnetization of the ferromagnetic layer sandwich 41 is surely pinned even if the thickness of the antiferromagnetic layer 7 is made thinner than before as described above, it becomes feasible to implement stable readout operation in the spin valve film 47 and the thin film magnetic head MH1.

Here some explanation will also be given about magnetic recording of data. The magnetic field creating device RD for writing magnetic data is mechanically coupled to and on the magnetic detecting device MD of the thin film magnetic head MH1. Data is written into the magnetization transition area of the magnetic recording medium by the leakage field from the magnetic field creating device RD.

Thin film magnetic heads with the spin valve film as in the present embodiment were fabricated and evaluated as to the performance including the MR ratio and others.

The MR devices formed as thin film magnetic heads corresponding to the above embodiment had the basic configuration of NiCr (5 nm)/antiferromagnetic layer/ferromagnetic layer sandwich/Cu (1.9 nm)/CoFe (2.5 nm) (free layer)/Cu (3 nm)/Ta (2 nm). Numerals are based on the unit of nm. Here the ferromagnetic layer sandwich was of the synthetic structure consisting of the layer structure/Ru (0.8 nm)/$Co_{90}Fe$ (1.6 nm).

EXAMPLES 22–24

The configuration of antiferromagnetic layer/layer structure was $IrMn_{80}$ (5 nm)/$Co_{90}Fe$ (0.5 nm)/$Fe_{95}Ta$/$Co_{90}Fe$ (0.5 nm), as presented in the table of FIG. 7, and the thickness of $Fe_{95}Ta$ as the layer of the body-centered cubic structure was 0.5, 0.7, or 0.9 nm in order of Examples 22–24.

EXAMPLES 25–27

The configuration of antiferromagnetic layer/layer structure was $IrMn_{80}$ (5 nm)/$Co_{90}Fe$ (0.5 nm)/$Fe_{50}Co$/$Co_{90}Fe$ (0.5 nm) and the thickness of $Fe_{50}Co$ as the layer of the body-centered cubic structure was 0.5, 0.7, or 0.9 nm in order.

COMPARATIVE EXAMPLE 11

The magnetic head was made in the same manner as in Example 22 except that the configuration of antiferromagnetic layer/layer structure was $IrMn_{80}$ (5 nm)/$Co_{90}Fe$ (1.5 nm).

COMPARATIVE EXAMPLE 12

The magnetic head was made in the same manner as in Example 22 except that the configuration of antiferromagnetic layer/layer structure was PtMn (13 nm)/$Co_{90}Fe$ (1.5 nm).

The MR ratios and the amount of resistance change of these thin film magnetic heads are presented in FIG. 7.

It is clearly seen from Examples 22–27 that the thin film magnetic heads with the spin valve film according to the present embodiment achieve the decrease in the film thickness of the antiferromagnetic layer without decrease of the exchange coupling energy, thus decrease the shunt ratio of the sense current flowing in the antiferromagnetic layer, and eventually increase the MR ratio and the amount of resistance change, as compared with Comparative Example 12 being the aforementioned conventional configuration.

It is noted that the MR ratio can be increased by decreasing the film thickness of the antiferromagnetic layer even in the case of the spin valve film having the exchange-coupled film consisting of the disordered alloy and the conventional ferromagnetic layer sandwich different from the configuration in which the ferromagnetic layer of the face-centered cubic structure is placed between the ferromagnetic layers of the body-centered cubic structure as seen in Comparative Example 11. However, it is difficult to put it into practical use, because the exchange coupling energy is low as previously described in Comparative Examples 1–4.

Figure 8:
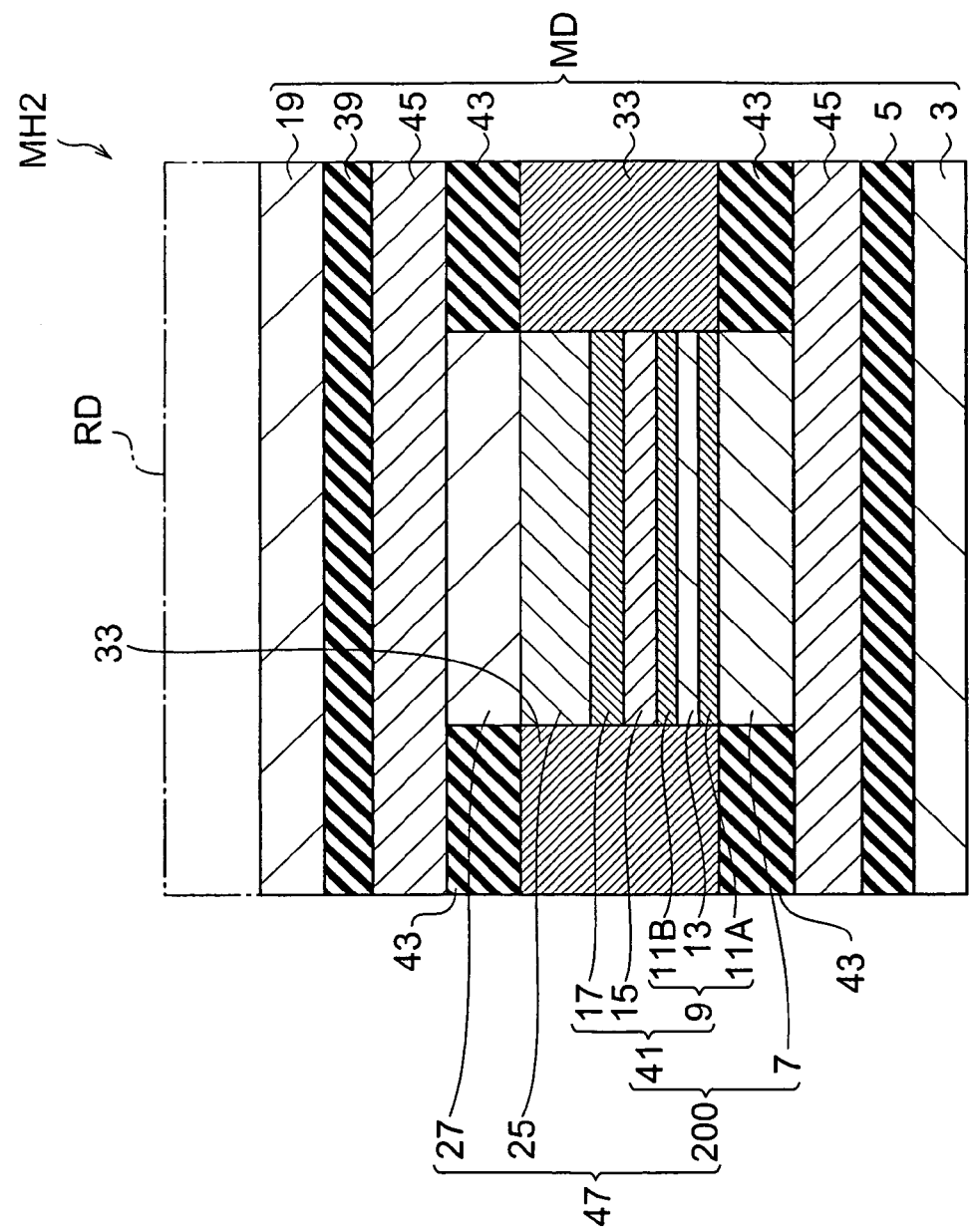
FIG. 8 is a schematic illustration showing a sectional structure of another thin film magnetic head according to an embodiment of the present invention.

The thin film magnetic head MH2 according to an embodiment of the present invention will be described below with reference to FIG. 8.

The thin film magnetic head MH2 according to the present embodiment is different from the thin film magnetic head MH1 in that one electrode layer 45 is laid so as to be in electrical contact with the top surface of the spin valve film 47 and the other electrode layer 45 is laid so as to be in electrical contact with the bottom surface of the spin valve film 47 and in that the sense current flows in the stack direction of the spin valve film 47. The thin film magnetic head of this type is called a CPP (Current Perpendicular to Plane) type GMR head.

In correspondence with this configuration, insulating layers 43, 43 of alumina or the like are formed, instead of the under layer 31 and protective layer 35, up and down on the hard magnetic layer 33 and between the electrode layers 45.

Since the thin film magnetic head MH2 of the present embodiment adopts the spin valve film 47 capable of achieving the sufficient exchange coupling energy while making the thickness of the antiferromagnetic layer thinner as the aforementioned thin film magnetic head MH1 did, it is feasible to narrow the gap between the upper magnetic shield layer 19 and the lower magnetic shield layer 3 without degradation of reliability and to substantialize the magnetic head of narrow gap structure.

In addition, the decrease in the thickness of the antiferromagnetic layer 7 leads to a decrease of the resistance in flow of the electric current flowing through the antiferromagnetic layer 7 in the spin valve film 47, and this increases the MR ratio of the magnetic head.

Next, the magnetic head apparatus and magnetic recording/reproducing apparatus with the aforementioned thin film magnetic head MH1 or MH2 will be described below.

Figure 9:
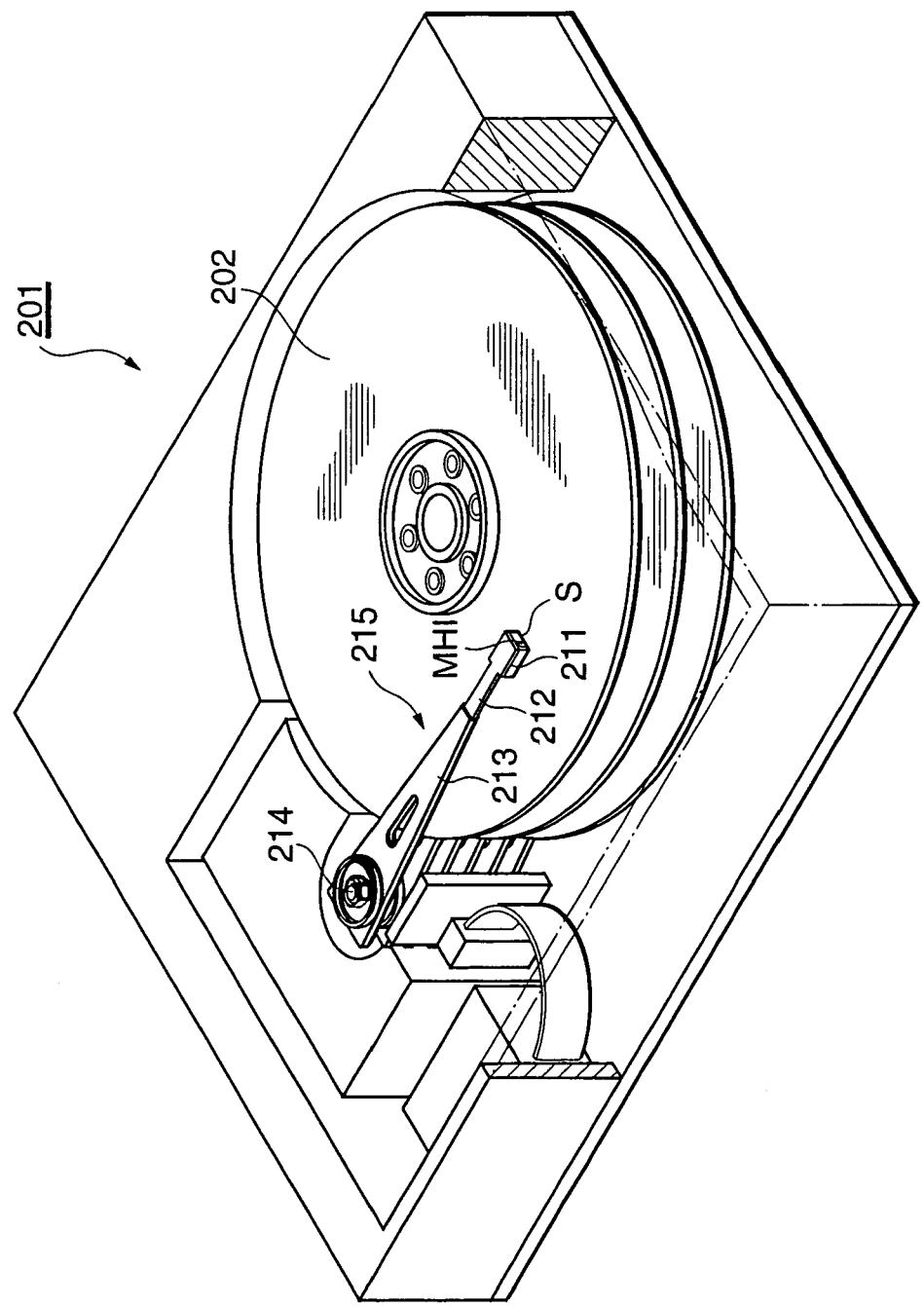
FIG. 9 is a perspective view showing a hard disk device according to an embodiment of the present invention.

FIG. 9 is a perspective view showing a hard disk apparatus (magnetic recording/reproducing apparatus) 201 according to an embodiment of the present invention. The hard disk apparatus 201 is constructed so as to actuate a head arm assembly (HAA) (magnetic head apparatus) 215 and record and reproduce magnetic information (magnetic signals) on a recording surface (upper surface in FIG. 9) of each hard disk (magnetic recording medium) 202 rotating at high speed, by thin film magnetic head MH1.

The head arm assembly 215 is comprised of gimbal (head supporting device) 212 carrying slider 211 with the aforementioned thin film magnetic head MH1 formed therein, and suspension arm 213 to which the gimbal is coupled, and can be rotated about shaft 214, for example, by a voice coil motor. The thin film magnetic head MH1 may be replaced by MH2. As the head arm assembly 215 is rotated, the slider 211 moves in the radial direction of the hard disk 202, i.e., in the direction transverse to track lines.

Figure 10:
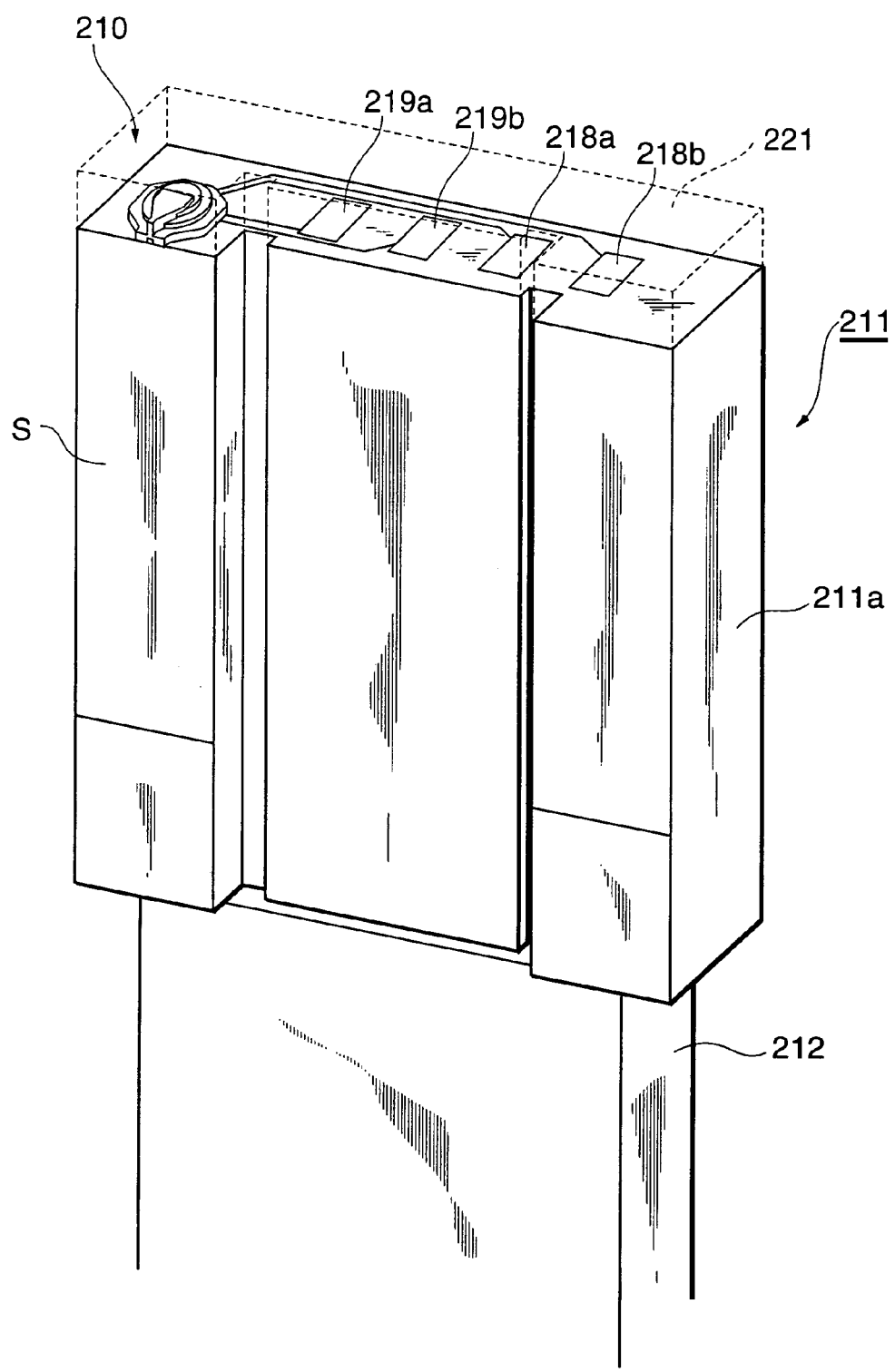
FIG. 10 is an enlarged perspective view of a slider of FIG. 9.

FIG. 10 is an enlarged perspective view of slider 211. The slider 211 is of approximately rectangular parallelepiped shape and the thin film magnetic head MH1 is formed on base 211a of AlTiC ($Al_2O_3$-TiC). The surface on this side in the same figure is a surface facing a recording surface of hard disk 202 and is called an air bearing surface (ABS) S. As the hard disk 202 is rotated, the slider 211 comes to float by air flow caused by the rotation and the air bearing surface S is kept apart from the recording surface of the hard disk 202.

Recording terminals 218a, 218b and reproducing terminals 219a, 219b are connected to the thin film magnetic head MH1 and the suspension arm 213 shown in FIG. 9 is provided with wires (not shown) for input/output of electric signals, which are connected to the respective terminals. Overcoat layer 221 indicated by dashed lines in the figure is provided for protecting the thin film magnetic head MH1. The air bearing surface S may be coated with a coating of DLC (Diamond Like Carbon) or the like.

Since the head arm assembly 215 and hard disk apparatus 201 as described above use the foregoing thin film magnetic head MH1 or MH2, they present the operational effect similar to that described above.

It is noted that the present invention is by no means intended to be limited to the above embodiments but can be modified in a variety of modification forms.

For example, in the thin film magnetic heads MH1, MH2, the ferromagnetic layer sandwich 41 forming the exchange-coupled film 200 is of the so-called synthetic structure in which the layer structure 9 and the third ferromagnetic layer 17 are stacked through the nonmagnetic intermediate layer 15, but the ferromagnetic layer sandwich 41 can be comprised of only the layer structure 9.

The thin film magnetic head MH2 may be constructed as a TMR head in which the nonmagnetic, conductive layer 25 is replaced by an insulating layer of alumina or the like.

The exchange-coupled film and spin valve film according to the embodiment of the invention can also be applied to MRAM (magnetic random access memory) or the like.

As described above, the present invention has provided the exchange-coupled film that can be made thinner than before and that yields the sufficient exchange coupling energy, the spin valve film using it, the thin film magnetic head, the magnetic head apparatus, and the magnetic recording/reproducing apparatus. This permits implementation of higher density in the hard disk apparatus and others.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

The basic Japanese Application No. 2002–263199 filed on Sep. 09, 2002 is hereby incorporated by reference.

What is claimed is:

1. An exchange-coupled film in which an antiferromagnetic layer and a ferromagnetic layer sandwich are stacked and in which a direction of magnetization of the ferromagnetic layer sandwich is pinned, wherein said ferromagnetic layer sandwich comprises a first ferromagnetic layer containing a ferromagnetic material of the body-centered cubic structure, and a pair of second ferromagnetic layers containing a ferromagnetic material of the face-centered cubic structure and formed on respective sides of the first ferromagnetic layer, and wherein said antiferromagnetic layer contains a disordered alloy chosen from the group consisting of IrMn alloys, RuRhMn alloys, FeMn alloys and RuMn alloys, and said antiferromagnetic layer is kept in contact with one of said second ferromagnetic layers, and wherein said antiferromagnetic layer has a thickness of 10 nm less and wherein said exchange-coupled film yields a high exchange coupling energy Jk of not less than 263 µJ/m².

2. The exchange-coupled film according to claim 1, wherein the ferromagnetic layer sandwich further comprises a third ferromagnetic layer placed through a nonmagnetic intermediate layer on the opposite side to the antiferromagnetic layer with the other second ferromagnetic layer in between.

3. A spin valve film comprising the exchange-coupled film as set forth in claim 1; a nonmagnetic, conductive layer laid on the ferromagnetic layer sandwich of the exchange-coupled film; and a free layer laid on the nonmagnetic, conductive layer and containing a ferromagnetic material.

4. A thin film magnetic head comprising the spin valve film as set forth in claim 3, and a pair of magnetic shield layers placed at positions where the spin valve film is sandwiched therebetween from both sides in a stack direction of the spin valve film, and containing a soft magnetic material.

5. The thin film magnetic head according to claim 4, comprising a pair of electrode layers electrically connected to the spin valve film and adapted for allowing an electric current to flow parallel to a film surface of the spin valve film.

6. The thin film magnetic head according to claim 4, comprising a pair of electrode layers electrically connected to the spin valve film and adapted for allowing an electric current to flow perpendicular to a film surface of the spin valve film.

7. A magnetic head apparatus comprising the thin film magnetic head as set forth in claim 4; and a head supporting device for supporting the thin film magnetic head.

8. A magnetic recording/reproducing apparatus comprising the magnetic head apparatus as set forth in claim 7; and a magnetic recording medium for implementing magnetic recording/reproduction in collaboration with the thin film magnetic head of the magnetic head apparatus.

9. The exchange-coupled film according to claim 1, wherein said antiferromagnetic layer has a thickness in the range of 5 to 10 nm.

* * * * *

UNITED STATES PATENT AND TRADEMARK OFFICE
CERTIFICATE OF CORRECTION

PATENT NO. : 7,029,770 B2  
APPLICATION NO. : 10/633669  
DATED : April 18, 2006  
INVENTOR(S) : Koji Shamazawa; Yoshihiro Tsushiya and Koichi Terunuma It is certified that error appears in the above-identified patent and that said Letters Patent is hereby corrected as shown below:

Column 15, line 2, before "less", insert --or--.

Signed and Sealed this

Twenty-fifth Day of July, 2006

JON W. DUDAS  
*Director of the United States Patent and Trademark Office*